(12) United States Patent
Krishnan et al.

(10) Patent No.: US 6,274,915 B1
(45) Date of Patent: Aug. 14, 2001

(54) METHOD OF IMPROVING MOS DEVICE PERFORMANCE BY CONTROLLING DEGREE OF DEPLETION IN THE GATE ELECTRODE

(75) Inventors: Srinath Krishnan, Campbell; Ming-Yin Hao, Sunnyvale; David Bang, Palo Alto; Witold Maszara, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,646

(22) Filed: Jan. 5, 1999

(51) Int. Cl.$^7$ ................................................. H01L 29/76
(52) U.S. Cl. ............................................ 257/407; 257/412
(58) Field of Search ................................ 257/402, 403, 257/404, 405, 407, 412, 413

(56) References Cited

U.S. PATENT DOCUMENTS

| | | | |
|---|---|---|---|
| 3,615,934 | * 10/1971 | Bower | 257/368 |
| 3,673,471 | * 6/1972 | Klein et al. | 257/407 |
| 5,674,788 | 10/1997 | Wristers et al. | 437/239 |
| 5,757,204 | 5/1998 | Nayak et al. | 324/769 |
| 5,783,469 | 7/1998 | Gardner et al. | 438/199 |
| 5,789,780 | 8/1998 | Fulford et al. | 257/344 |

* cited by examiner

Primary Examiner—Sara Crane
(74) Attorney, Agent, or Firm—Skjerven Morrill MacPherson LLP; Roberta P. Saxon

(57) ABSTRACT

A design for an MOS transistor deliberately uses depletion in a polysilicon gate electrode to improve circuit performance. Conventional transistor design seeks to minimize depletion in a polysilicon gate electrode to increase drive current. According to an embodiment of the present invention, appropriate levels of depletion in the gate electrode, larger than conventional levels, simultaneously provide desired drive current while minimizing circuit delay. According to another aspect, circuit performance is improved by adjusting doping levels in the channel region to maintain a threshold voltage at the same level as that which is achieved with minimum depletion in a polysilicon gate electrode. A method of fabricating an MOS device including a polysilicon gate electrode with increased depletion is also provided. A self-aligned doping process is used in which the polysilicon gate, the source region, and the drain region, are simultaneously implanted to dopant concentrations of between $1 \times 10^{19}$ and $5 \times 10^{19}$ atoms/cm$^3$.

8 Claims, 1 Drawing Sheet

METHOD OF IMPROVING MOS DEVICE PERFORMANCE BY CONTROLLING DEGREE OF DEPLETION IN THE GATE ELECTRODE

TECHNICAL FIELD

The present invention relates generally to semiconductor devices and more particularly to semiconductor devices in which the gate electrodes are composed of polysilicon with dopant depletion.

BACKGROUND

The design principles and fabrication of conventional MOS transistors are well known. Typically, an MOS transistor includes a channel region in a semiconductor substrate between a doped source region and a doped drain region in the substrate. A conductive gate electrode overlies the channel region, physically separated from the substrate by a thin silicon oxide insulating layer, termed the gate oxide.

MOS transistor performance is characterized by a drive current, which is the current flowing between source and drain regions when the transistor is conducting, and by circuit delay. For desirable performance, the goal is to maximize the drive current and to minimize circuit propagation delay for a given geometry.

Polysilicon is frequently used as the material for forming the gate electrode for MOS transistor devices. Polysilicon adheres well to gate oxides and is able to withstand the environmental changes during processing steps subsequent to the gate electrode being formed. An impurity species, or dopant, is incorporated in the polysilicon to make the polysilicon conducting. The dopant species used in conventional transistor processing include phosphorous and arsenic, for creating n-type polysilicon, and boron or $BF_2$, for creating p-type polysilicon. Conventionally, a high dopant concentration is used to reduce the degree of depletion in the polysilicon gate. The degree of depletion is the thickness of the region in the polysilicon gate adjacent the gate oxide layer, in which space charge develops when the transistor device is conducting. The conventional approach is to minimize the level of depletion, which may result in an improvement in drive current.

However, maximizing the dopant concentration to minimize the level of depletion can have additional effects. The higher the doping level, the more defects are created in the polysilicon. When boron is used as a dopant, higher concentrations of boron increase the likelihood of boron penetration, the tendency of boron to diffuse out of the polysilicon gate into the gate oxide layer, which undesirably can affect device reliability. Furthermore, minimizing the level of depletion does not necessarily improve propagation delay. Under certain conditions, as depletion levels are decreased, circuit delay can actually increase.

Thus, it would be desirable to provide a design for an MOS transistor that simultaneously increases drive current and device speed, and minimizes circuit delay. It would further be desirable to provide a method of manufacturing such a device.

SUMMARY

A design for an MOS transistor deliberately uses depletion in a polysilicon gate electrode to improve circuit performance. According to an embodiment of the present invention, appropriate levels of depletion in the gate electrode, larger than conventional levels, simultaneously provide desired drive current while minimizing circuit delay. According to another aspect, circuit performance is improved by adjusting doping levels in the channel region to maintain a threshold voltage at the same level as that which is achieved with minimum depletion in a polysilicon gate electrode.

The degree of depletion in the gate electrode is increased by adjusting the doping level of the polysilicon gate downward. Dopant concentrations of between $1 \times 10^{19}$ and $5 \times 10^{19}$ atoms/cm$^3$ are advantageously used. Alternatively, the degree of depletion in the gate electrode is increased by using amorphous silicon as the gate electrode material instead of polysilicon. In yet another alternative, the benefits of a higher degree of depletion in the gate electrode are achieved by increasing the thickness of a polysilicon gate electrode relative to the horizontal dimensions of the device. The ratio of the thickness of the polysilicon gate electrode to the channel length, which may be taken as a characteristic device feature size, ranges between 0.6 and 1.5.

According to another embodiment of the present invention, a method of AS fabricating an MOS device including a polysilicon gate electrode with increased depletion is provided. A self-aligned process is used in which the polysilicon gate, the source region, and the drain region, are simultaneously implanted to dopant concentrations of between $1 \times 10^{19}$ and $5 \times 10^{19}$ atoms/cm$^3$. The light dopant concentration is beneficial in providing desirably shallow source and drain regions and in limiting boron penetration problems in the case of boron as a dopant.

BRIEF DESCRIPTION OF THE DRAWING

The present invention may be better understood, and its numerous objects, features, and advantages made apparent to those skilled in the art by referencing the accompanying drawing.

DETAILED DESCRIPTION

Figure 1:
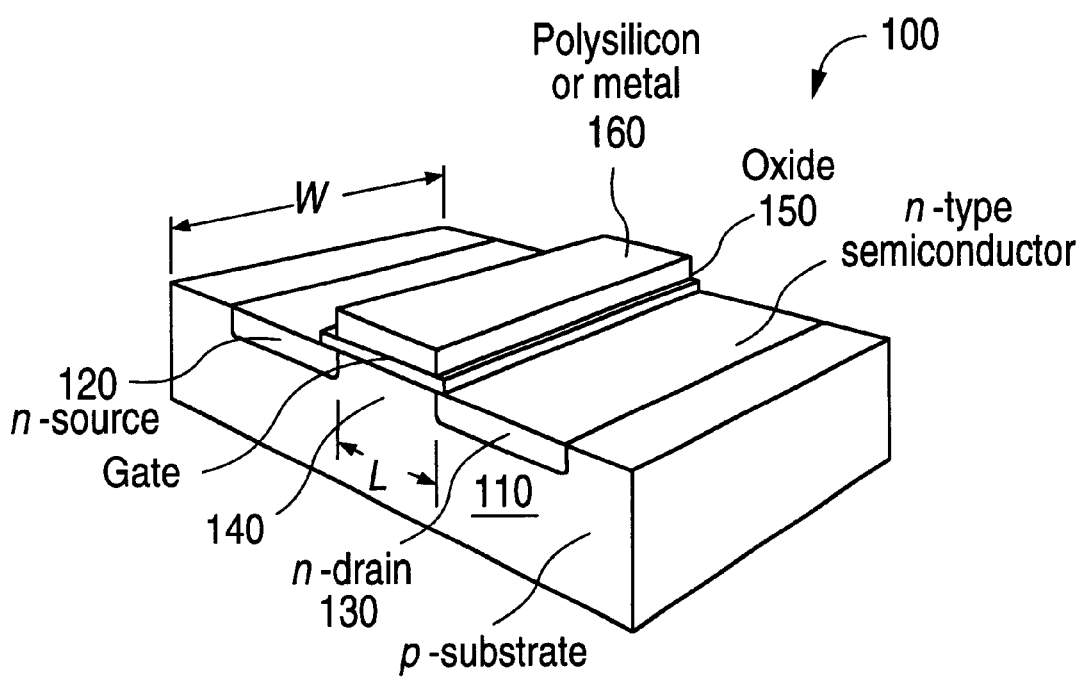
FIG. 1 shows the structure of an MOS device in which embodiments of the present invention can be implemented.

A design for an MOS transistor deliberately uses depletion in a polysilicon gate electrode to improve circuit performance. FIG. 1 shows elements of an MOS transistor 100 including a source region 120 and a drain region 130 in a semiconductor substrate 110. A channel region 140 of length L and width W separates the source region 120 and drain region 130. Source region 120 and drain region 130 are typically implanted with dopants of the same type, while substrate 110 including channel region 140 are implanted with dopants of the opposite type. That is, for p-type source 120 and drain 130 regions, the channel region 140 is n-type. A conductive gate electrode 160 overlies the channel region 140 separated from the substrate by a thin insulating layer 150, typically of silicon oxide. Heavily doped polysilicon is frequently used as gate electrode 160.

Typically, the dopant concentration incorporated in the polysilicon gate is maximized to reduce the degree of depletion in the polysilicon. The minimum degree of depletion corresponds to a maximum level of doping, termed degenerate doping, beyond which increasing the concentration of dopant does not change the electrical properties of the polysilicon. The reduction in depletion results in an increased gate capacitance, $C_g$, and a corresponding increase in drive current, $I_{dsat}$, which is given in terms of conventional device parameters by the formula:

$$I_{dsat} = W\, Cg(V_{gate} - V_t) \mu_{eff} E \qquad (1)$$

where W is the channel width, $V_{gate}$ is the gate voltage, $V_t$ is the threshold voltage, $\mu_{eff}$ is the effective mobility in the channel 140 near the source 120 and E is the electric field near the source.

However, propagation delay may not necessarily decline with minimized depletion level. Gate-dominated delay is proportional to the ratio of gate capacitance to drive current:

$$D \, C_g I_{dsat}, \quad (2)$$

where D is the propagation delay. In Formula (2), any improvement in drive current is offset by an equivalent increase in gate capacitance. In addition, effective channel mobility tends to decrease with decreasing polysilicon depletion level. As the delay is inversely proportional to $\mu_{eff}$ through the relationship of Formula (1), the delay can actually increase with decreasing depletion in the polysilicon gate.

According to an embodiment of the present invention, use of polysilicon gate electrodes with increased degrees of depletion improves MOS device performance by simultaneously providing advantageous device currents and minimizing gate-dominated circuit delay. Analysis using Formulas (1) and (2), analogous to the conventional case above of minimized depletion, can be applied. In the present case, raising polysilicon gate depletion levels results in lowering gate capacitance, $C_g$. However, the effect on the drive current is compensated by an increase in effective mobility, μeff, while the delay, D, is lowered by the increase in mobility.

According to another aspect of the present invention, circuit performance is improved by adjusting doping levels in the channel region 140 to maintain a threshold voltage at the same level as that which is achieved with minimum depletion in a polysilicon gate electrode. Threshold voltage is controlled by gate capacitance:

$$V_t V_{FB} + \phi_b + Q_b / C_g, \quad (3)$$

where, $V_{FB}$ is the flatband voltage, $Q_b$ is the depletion charge in the channel 140, and $\phi_b$ is the potential in the channel under flatband conditions $$\phi_b \, (kT/q) \ln(N_{ch}/n_i), \quad (4)$$

with k, the Boltzmann constant, T the ambient temperature, q the electronic charge, $N_{ch}$ the concentration of dopants in the channel, and $n_i$ the intrinsic carrier concentration in substrate 110. Under conditions of increased depletion in the gate, the gate capacitance is lowered and the threshold voltage is raised, because of the last term in Formula (3). To maintain the threshold voltage at the same level as with minimum gate depletion, the concentration of dopants in the channel, $N_{ch}$, is lowered. This further enhances the effective mobility $\mu_{eff}$ and drive currents due to reduction of impurity scattering. The quantities in Formulas (1)–(4) are described, for example, in the book by S. M.Sze, "Semiconductor Devices, Physics, and Technology", (John Wiley and Sons, 1985).

As discussed further below, one approach to adjusting the level of depletion of the gate electrode is to adjust the doping level of the polysilicon. For increased depletion, the dopant concentration in the gate is reduced. Device performance as a function of dopant concentration in the polysilicon gate and in the channel region is effectively simulated using the 2D-device simulation software tool, Medici (2D) provided by TMA of Fremont, Calif. The quantities, $C_g$ and $I_{dsat}$ are obtained from the numerical simulation. Gate delay is computed using an analytical formula. Results are presented below in Table 1, where NPIY is the concentration of dopants in the polysilicon gate.

TABLE 1

Simulated Device Performance

| | $N_{poly}$ (atoms/cm$^3$) | $N_{ch}$ (atoms/cm$^3$) | Gate delay (ps) | $I_{dsat}$ (μA/μm) |
|---|---|---|---|---|
| Example 1 | $1 \times 10^{20}$ | $2 \times 10^{18}$ | 7.3 | 787 |
| Example 2 | $7 \times 10^{19}$ | $1.86 \times 10^{18}$ | 6.89 | 784 |
| Example 3 | $4 \times 10^{19}$ | $1.68 \times 10^{18}$ | 6.13 | 769 |

Example 1 corresponds to a conventional MOS device with minimum gate depletion. In Examples 2 and 3, $N_{ch}$ has been adjusted to give the same value of the threshold voltage, $V_t$, as in Example 1. The results of Examples 2 and 3 demonstrate that even with reduced gate doping, that is with increased depletion in the gate electrode, by adjusting the channel doping, the gate delay actually decreases and the drive current does not degrade. When the doping concentration is decreased by 60%, the drive current decreases by only 2 % and the gate delay improves by 16%. Increased depletion results in a device with improved performance.

According to an embodiment of the present invention, MOS devices with high degrees of depletion in the gate electrode have polysilicon gates with dopant concentrations of between $1 \times 10^{19}$ and $5 \times 10^{19}$ atoms/cm$^3$. In an alternative embodiment, the MOS devices with high degrees of depletion in the gate electrode have amorphous silicon as the gate electrode material instead of polysilicon. The amorphous silicon has dopant concentrations at the same levels as those of the polysilicon, between $1 \times 10^{19}$ and $5 \times 10^9$ atoms/cm$^3$. However, the active dopant concentration in amorphous silicon is less than in polysilicon, leading to high degrees of depletion in amorphous silicon gate electrodes. In yet another alternative, the benefits of a higher degree of depletion in the gate electrode are achieved by 5 increasing the thickness of a polysilicon gate electrode relative to the horizontal dimensions of the device. The ratio of the thickness of the polysilicon gate electrode to the channel length, which may be taken as a characteristic device feature size, ranges between 0.6 and 1.5.

According to another embodiment of the present invention, a method of 10 fabricating an MOS device including a polysilicon gate electrode with increased depletion is provided. First an impurity species, or dopant, at a concentration of between $1 \times 10^{10}$ and $1 \times 10^{15}$ is introduced into semiconductor substrate 110 by a conventional process. The channel region 140 is prepared to have dopant concentration between approximately $1 \times 10^{17}$ and $5 \times 10^{18}$ atoms/cm$^3$. An oxide layer is formed on the top surface of substrate 110 and a layer of polysilicon is formed on the oxide layer. The oxide and polysilicon layers are patterned by a conventional process to form the gate structure consisting of gate oxide layer 150 and polysilicon gate 160. Next a self-aligned doping process in which the polysilicon gate, the source region, and the drain region, are simultaneously implanted to dopant concentrations of between $1 \times 10^{19}$ and $5 \times 10^{19}$ atoms/cm$^3$ is carried out. For arsenic as the dopant species, to create n-type source and drain regions and an n-type polysilicon gate, the implant energy is in the range of 10–100 keV. For B or $BF_2$ as the dopant species, to create p-type source and drain regions and a p-type polysilicon gate, an implant energy in the range of 10–100 keV and an implant dose of between $1 \times 10^{14}$ and $1 \times 10^{16}$ atoms/cm is used. Those skilled in the art can optimize the implant energy for the device geometry, dopant species, and dopant levels of a particular device. The lighter than conventional dopant concentration is beneficial in providing desirably shallow source and drain regions and in limiting boron penetration problems in the case of boron as a dopant. Thus, the benefits of MOS devices with increased depletion levels in the gate electrode are realized by adjusting dopant levels without requiring major process changes.

Although the invention has been described with reference to particular embodiments, the description is only an example of the invention's application and should not be taken as a limitation. In particular, while particular methods of providing gate electrodes with increased depletion levels have been described, alternative materials and methods can also be employed. Various adaptations and combinations of features of the embodiments disclosed are within the scope of the invention as defined by the following claims.

What is claimed is:

1. A transistor comprising:
   a semiconductor substrate;
   a source region within said substrate;
   a drain region within said substrate, separated from said source region by a channel region within said substrate, wherein said channel region has an impurity concentration of between $1 \times 10^{17}$ and $5 \times 10^{18}$ atoms/cm$^3$;
   an insulating layer formed on an upper surface of said channel region; and
   a conductive gate formed on said insulating layer, the conductive gate comprising polysilicon with an impurity concentration of between $1 \times 10^{19}$ and $5 \times^{19}$ atoms/cm$^3$, wherein when said transistor is conducting, the degree of depletion of the conductive gate is greater than a minimum degree of depletion.

2. The transistor of claim 1 wherein said conductive gate comprises p-type polysilicon and said channel region comprises n-type silicon.

3. The transistor of claim 1 wherein said conductive gate comprises n-type polysilicon and said channel region comprises p-type silicon.

4. A transistor comprising:
   a semiconductor substrate;
   a source region within said substrate;
   a drain region within said substrate, separated from said source region by a channel region within said substrate, wherein said channel region has an impurity concentration of between $1 \times 10^{17}$ and $5 \times 10^{18}$ atoms/cm$^3$;
   an insulating layer formed on an upper surface of said channel region; and
   a conductive gate formed on said insulating layer, the conductive gate comprising amorphous silicon with an impurity concentration of between $1 \times 10^{19}$ and $5 \times 10^{19}$ atoms/cm$^3$, wherein when said transistor is conducting, the degree of depletion of the conductive gate is greater than a minimum degree of depletion.

5. A method of fabricating a transistor device comprising:
   providing a semiconductor substrate;
   doping said substrate to prepare a channel region having a dopant concentration of between $1 \times 10^{17}$ and $5 \times 10^{18}$ atoms/cm$^3$;
   forming an insulating layer on a top surface of said semiconductor substrate adjacent said channel region;
   forming a layer of polysilicon on said insulating layer;
   patterning said polysilicon layer and said insulating layer to form a polysilicon gate and exposed surfaces of said substrate;
   implanting an impurity species into said exposed surfaces and said polysilicon gate simultaneously, wherein the concentration of impurity species in said polysilicon gate is between $1 \times 10^{19}$ and $5 \times 10^9$ atoms/cm$^3$ such that an increase in said impurity concentration changes the electrical properties of said polysilicon.

6. The method of claim 5 wherein providing a semiconductor substrate is providing a silicon substrate with a concentration of impurity species of between $1 \times 10^{10}$ and $1 \times 10^{15}$ atoms/cm$^3$.

7. The method of claim 5 wherein implanting an impurity species is implanting a phosphorous or arsenic species.

8. The method of claim 5 wherein implanting an impurity species is implanting a boron-containing species.

* * * * *